(12) United States Patent
Deb

(10) Patent No.: US 8,027,824 B2
(45) Date of Patent: Sep. 27, 2011

(54) PROTEIN SWITCHES INCORPORATING CYTOCHROME $C_3$ IN MONOLAYERS AND METHOD FOR PRODUCING SAME

(75) Inventor: Krishna K. Deb, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 574 days.

(21) Appl. No.: 11/934,076

(22) Filed: Nov. 1, 2007

(65) Prior Publication Data

US 2008/0217607 A1 Sep. 11, 2008

Related U.S. Application Data

(62) Division of application No. 10/191,026, filed on May 10, 2000, now Pat. No. 7,917,296.

(60) Provisional application No. 60/133,521, filed on May 10, 1999, provisional application No. 60/142,809, filed on Jul. 8, 1999.

(51) Int. Cl.
G01N 33/48 (2006.01)
C12M 1/00 (2006.01)
(52) U.S. Cl. ................................. 703/11; 435/283.1
(58) Field of Classification Search ...................... None
See application file for complete search history.

(56) References Cited

U.S. PATENT DOCUMENTS

| | | | | |
|---|---|---|---|---|
| 4,764,416 A | * | 8/1988 | Ueyama et al. | 428/212 |
| 4,802,951 A | * | 2/1989 | Clark et al. | 216/56 |
| 5,585,646 A | * | 12/1996 | Kossovsky et al. | 257/40 |
| 5,986,409 A | | 11/1999 | Farnworth et al. | |
| 6,160,257 A | | 12/2000 | Deb | |
| 6,259,096 B1 | | 7/2001 | Deb | |

OTHER PUBLICATIONS

Hildebrandt, P., "Cytochrome C at Charged Interfaces. 1. Conformational and Redox Equilibria at the Electrode/Electrolyte Interface Probed by Surface-Enhanced Resonance Raman Spectroscopy," 28 Biochemistry (1989) pp. 6710-6721.
Edmiston,"Molecular Orientation Distributions in Protein Films. 1. Cytochrome c Adsorbed to Substrates of Variable Surface Chemistry", J . Am. Chem. Soc. 1997, 119, 560-570.
Kaufmann, et al. "Conductive polymer films for microbolometer applications," Proc. SPIE / vol. 2744 / Thermal Imagers and Their Technologies. 334 (1996).
Deb, K, "A protein microbolometer for focal plane arrays," Journal Materials Research Innovations Publisher Springer Berlin / Heidelberg ISSN 1432-8917 (Print) 1433-075X (Online) Issue vol. 2, No. 6 / Apr. 1999, pp. 318-320.
Czjzek M, et al. "Crystal structure of cytochrome c3 from Desulfovibrio desulfuricans Norway at 1.7 A resolution," Journal of molecular biology 1994;243(4):653-67.
"Molecular Switching Probed for Nanocomputers," CMP'S Tech Web Technology News Mar. 16, 1999.
"Protein Molecule Behaves Like Diode," Inside R & D, The Weekly Report on Technical Innovation, Mar. 6, 1996, vol. 25, No. 10.
Campbell, Neil, A., "Biology, Third Edition," p. 185, (1993) Published by the Benjamin/Cummings Publishing Company, Inc.
Deb, Krishna, "Update: A Protein Microbolometer for Focal Plane Arrays," Mat. Res. Innovat. (1999) 3:66-68.

* cited by examiner

*Primary Examiner* — Eric S DeJong
(74) *Attorney, Agent, or Firm* — William V. Adams; Lawrence E. Anderson

(57) ABSTRACT

A biomolecular electronic switch includes a first electrical contact, a second electrical contact, a programmable monolayer of either cytochrome c or cytochrome $c_3$ or bovine serum hormone sandwiched between the first and second electrical contacts and a substrate. These switches have high current-carrying capacities and are very fast. It appears that these protein materials can be either metals or semiconductors. Because of the high conductivity and tiny size, these globular proteins can be used to develop cost-effective, miniaturized FEDs, molecular diodes and rectifiers for nanocomputer chips.

7 Claims, 4 Drawing Sheets

Resistance of cyt. c vs. forcing currents at 30 °C.

| I (uA) | (ohm/sq) |
|---|---|
| 2 | 29.2 |
| 20 | 4.6 |
| 100 | 1.7 |
| 1000 | 0.5 |

TCR (%) of cyt. c vs. forcing current at 30 °C.

| I (uA) | TCR (%) |
|---|---|
| 2 | 23.0 |
| 20 | 30.0 |
| 100 | 16.4 |
| 1000 | 5.3 | a. Ribbon representation of the *Desulfovibrio desulfuricans* Norway cytochromec3 srtructure (PDB code 2CY3).
b. as rotated 125° around *y* axis.
c. Haem groups and haem iron axial ligand residues only. In this projection, His-48 is situated behind haem 1 group and His-89 is situated behind haem 4 group.
d. Rotated to show His-48 and His-89.

PROTEIN SWITCHES INCORPORATING CYTOCHROME C₃ IN MONOLAYERS AND METHOD FOR PRODUCING SAME

CLAIM TO PRIORITY

This Application is a Division of prior application Ser. No. 10/191,026 filed May 10, 2000, now U.S. Pat. No. 7,917,296 which in turn claimed priority under 35 U.S.C. §119(e) based on provisional application Ser. No. 60/133,521 filed on May 10, 1999, and provisional application Ser. No. 60/142,809 filed on Jul. 8, 1999.

FIELD OF THE INVENTION

This invention is related to the field of biomolecular switching using monolayers of globular proteins. More particularly, the invention relates to nano-sized, molecular switches made from the monolayer films of different globular protein structures consisting of cytochrome c, cytochrome $c_3$ and bovine serum albumen. These proteins are adsorbed on oxidized silicon or another suitable semiconductor substrate using the techniques described by the inventor in (1), incorporated by reference as if fully set forth, and are particularly suited to use as programmable switches for nanocomputers and near-term nanotube applications, such as in field emission displays (FEDs).

BACKGROUND

In this application several publications are referenced by Arabic numerals in brackets [ ]. Full citations for these publications may be found at the end of the written description immediately preceding the claims. The disclosures of all such publications, in their entireties, are hereby expressly incorporated by reference in this application as if fully set forth, for purposes of indicating the background of the invention and illustrating the state of the art. The basic functions of a digital binary computer are performed by devices that are capable of reversibly switching between two states often referred to as "0" and "1." Semiconductive devices that perform these various functions must be capable of switching between two states at very high speed using minimum amounts of electrical energy in order to enable the computer to perform useful work. At the present time, integrated circuits containing millions of transistors made from elemental, compound and alloy semiconductors such as silicon (Si), gallium arsenide (GaAs), aluminum gallium arsenide (AlGaAs) perform the basic switching functions in computers.

While extraordinary advances have been made in device miniaturization, fundamental physical limitations exist that prevent miniaturization beyond a certain point. Individual molecules are hundreds of times smaller than the smallest features conceivably attainable by semiconductor technology. Because it is the area taken up by each electronic element that matters, electronic devices constructed from molecules can be hundreds of times smaller than their semiconductor-based counterparts. Moreover, individual molecules are easily made exactly the same by the billions and trillions. The dramatic reduction in size, the sheer enormity of numbers in manufacture, and reversibility of switching operation are the prime benefits promised by the field of biomolecular switching using globular proteins such as cytochrome c, BSA or cytochrome $c_3$.

OBJECTS AND SUMMARY OF THE INVENTION

Research on molecular switching technology has been hampered however, by the lack of easily reproducible materials that exhibit reliable and reversible switching properties. Accordingly it is an object of the present invention to provide molecular switches using protein monolayers that are fully reversible, easy to fabricate, consume less power and are cost-effective. These protein switches are expected to have much broader temperature range of operation as compared with the switches built from organic materials. These and other objects are satisfied, at least in part, by a molecular switch that includes a first electrical contact, a second electrical contact, a monolayer of programmable protein films sandwiched between the first and second electrical contacts and a substrate.

Still other objects of the present invention will become readily apparent to those skilled in this art from the following description wherein, where there is shown and described a preferred embodiment of this invention, simply by way of illustration one of the modes to best carry out the invention. As will be realized, the invention is capable of other different embodiments and its several details are capable of modification in various, obvious aspects all without departing from the invention. Accordingly, the drawings and descriptions will be regarded as illustrative in nature and not restrictive.

BRIEF DESCRIPTION OF THE DRAWINGS

A better understanding of the invention will be obtained when the following detailed description of the invention is considered in connection with the accompanying drawings in which.

DETAILED DESCRIPTION OF PREFERRED EMBODIMENTS

Figure 3:
FIG. 3 shows a computer-generated 3-D depiction of the structure of cytachrome c.

The present invention involves electrical switching properties of Cytochrome c, cytochrome $c_3$ or (BSA), which all are conductive in monolayer structure. Cytochrome c is a % 12 kD globular protein composed of one polypeptide chain and a single iron protoporphyrin IX (heme) group whose orientation with respect to the three-dimensional polypeptide conformation is known. The computer-generated 3-D structure of cytachrome c [2] is shown in FIG. 3. Cytochrome c monolayer about 40-Å thick adsorbed on a suitable substrate is known to exhibit≅25% temperature coefficient of resistance near ambient temperature [3]. This is an example of a technical breakthrough in the IR bolometer technology recently demonstrated by the author. The monolayers of the same proteins also exhibit low sheet resistance around 0.5 to 1 $\Omega$/sq with a forcing current of about 1 mA. The $\Omega$/sq. behavior of cytochrome c monolayer is quite predictable and this low value of resistance could allow these films to carry tremendous current densities making these molecular devices extremely fast compared to those built from simple organic compounds. For background on this result concerning low resistance at 1 mA in cytochrome c layer, see U.S. patent application Ser. No. 09/114,249, filed on Sep. 17, 1998, and U.S. patent application Ser. No. 09/160,204, filed on Sep. 18, 1998, both of which are incorporated by reference herein as if fully set forth.

Figure 4:
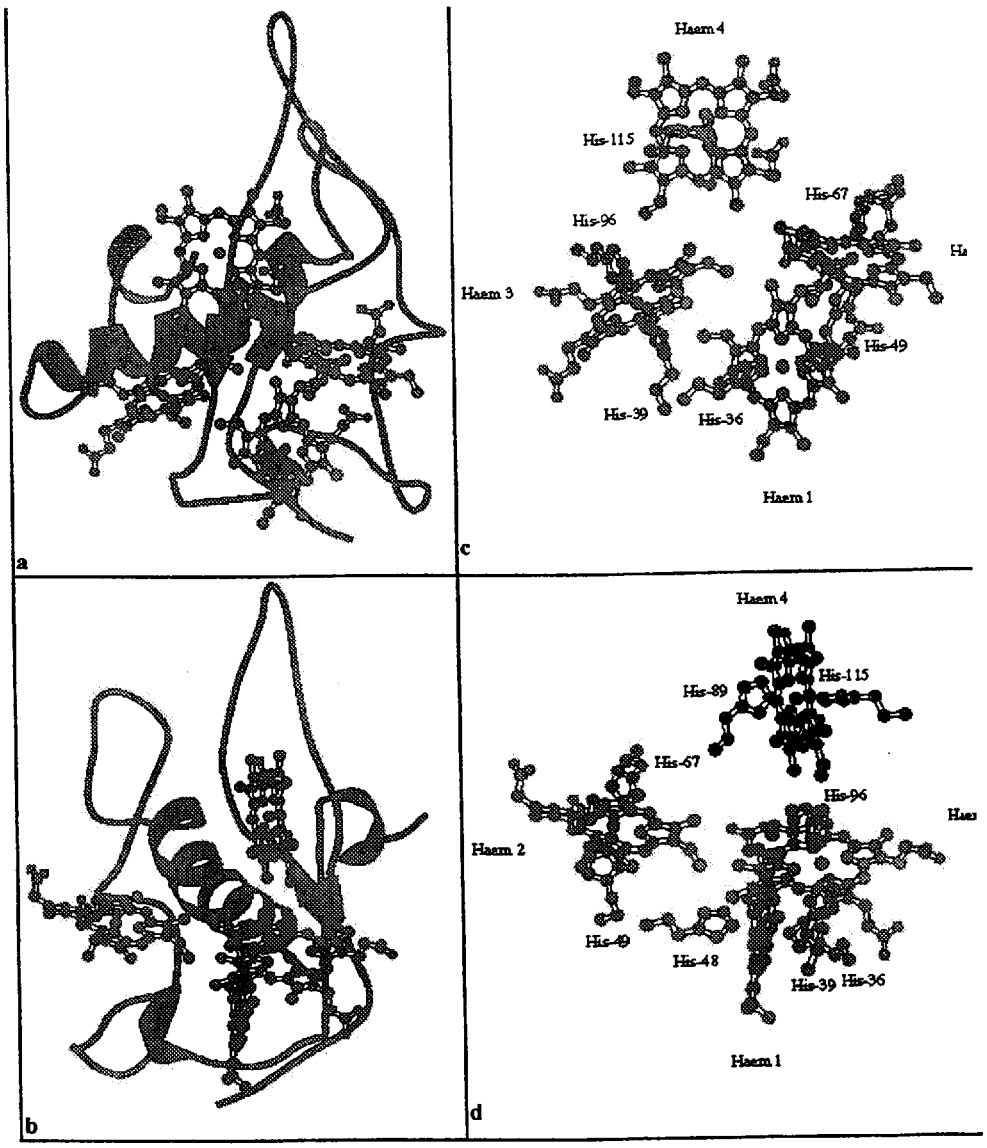
FIG. 4 shows a computer-generated 3-D depiction of the structure of cytochrome $c_3$.

Cytochrome $c_3$, a computer-generated model of which is shown in FIG. 4, is another protein which could be useful for an uncooled IR detector as well as for biomolecular switches. The X-ray structure of cytochrome $c_3$ has only recently been determined. The structure shows that cytochrome $c_3$ could be a very promising material for molecular switching because of the presence of three heme groups in a single molecule. As a result, cytochrome $c_3$ is expected to show much higher transport of electrons through the oriented monolayer where molecules are touching each other in the film.

In general, the inventor is of the view that all globular proteins having high dipole moments, including in particular cytochrome $c_4$, can be used advantageously as candidate materials for molecular switches. Cytochrome $c_4$ is a relatively new globular protein and its x-ray structure has not yet been determined. However, this protein has four heme groups which significantly enhance the current density in the monolayer of this material enhancing the speed of the molecular switches. Other devices such as molecular amplifiers or laser activated switches, molecular diodes and rectifiers, likewise can be realized with cytochrome c or cytochrome $c_3$ as the programmable active medium. Such protein switching devices are reversible, faster and highly cost effective as compared with similar organic switching devices. In addition, these globular proteins provide better temperature range of operation and they are not toxic. Therefore packaging of protein switches is not a problem in the manufacturing process.

Figures 1, 2:
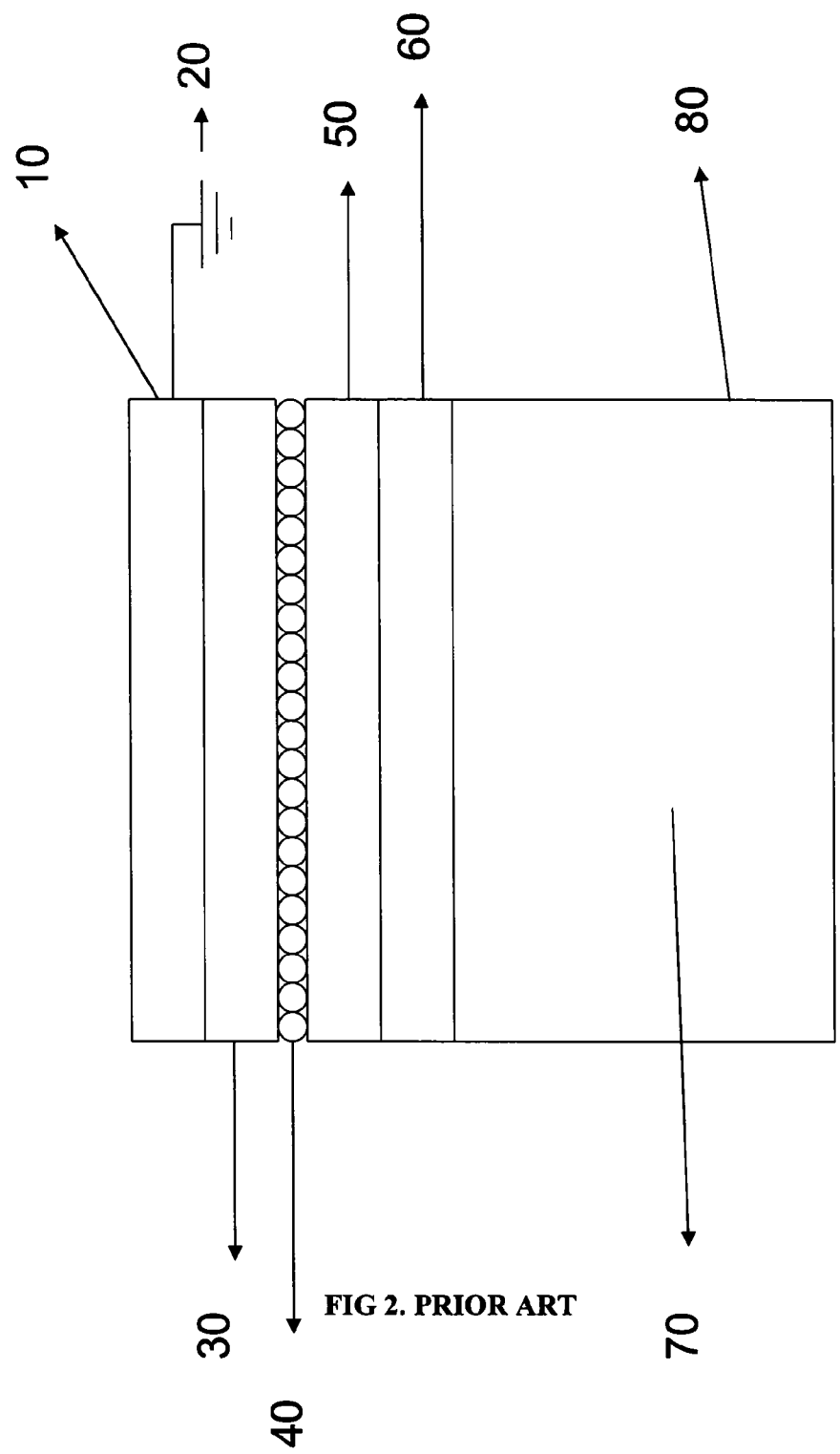
FIG. 1 is a sectional representaion of a preferred embodiment of the invention according to this application.
FIG. 2 is a graph showing variation of the sheet resistance ($\Omega$/sq) with the forcing current for cytochrome c. The curve representing the variation of $\Omega$/sq with forcing current for cytochrome $c_3$ would be very similar to FIG. 2.
Figure 2:
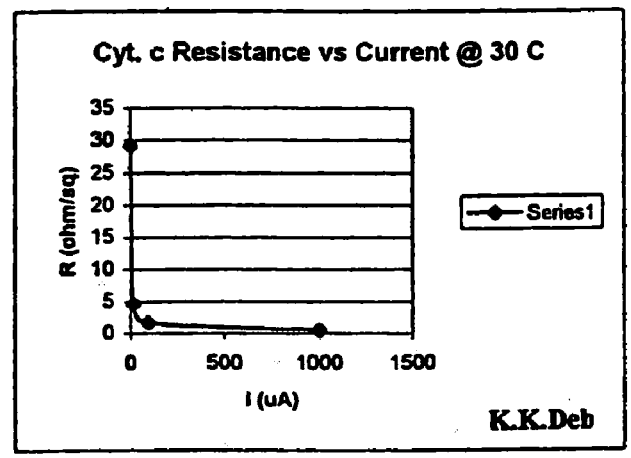
Figure 2:
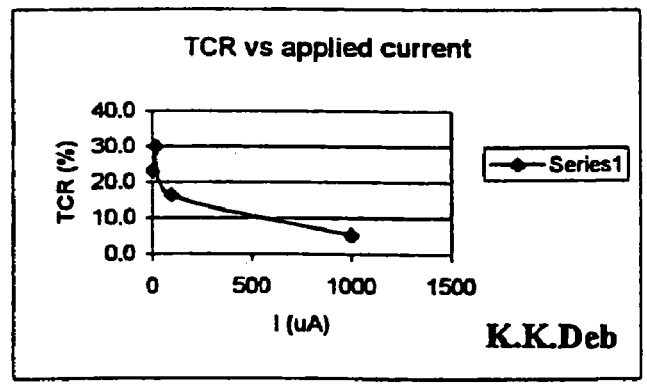

FIG. 1 shows an exemplary embodiment of a switching device according to the invention of this application. A pure aluminum electrode or fine wire 10, 40-100 Å thick, is laid directly on top of titanium or platinum layer electrode 30 which is between 30-80 Å in thickness. Platinum or titanium electrode 30 is laid directly on the top of a cytochrome c or cytochrome $c_3$ monolayer 40, 40 Å in thickness. A layer of aluminum oxide 50 between 50-80 Å is applied directly under monolayer 40. A pure aluminum electrode 60 of between 50-100 Å is applied to aluminum oxide 50 followed by a layer of silicon dioxide 70 and followed by a layer of silicon 80. Cytochrome c and cytochrome $c_3$, adsorbed as monolayer on SiO2/Si device have been investigated.

The results as shown in FIG. 2, demonstrate a very rapid decrease of sheet resistance ($\Omega$/sq) with the forcing current which approaches towards zero or negative values as the forcing current is increased. The TCR values also show very similar characteristics with the forcing current. The protein switches can be operated with smaller bias voltages and lower load resistance than most other active semiconductor circuit elements or organic molecules. Low-frequency differential negative resistance has been observed for a wide range of amorphous and polycrystalline insulators when organic mono-molecular layers are used as an insulator. The negative resistance is also manifested in the semiconductor superlattice devices and in the organic monomolecular layer sandwiched between metal electrodes. These effects were understood by the theory of resonant tunneling effect. The resonant effect in the super lattice or organic layer devices were suggested to originate from a certain energy level of the molecular orbits in the organic structure. In the case of a protein monolayer, the observed decrease in the sheet resistance with increase in the forcing current can not, however, be explained by the similar resonant tunneling mechanism. Cytochrome c or cytochrome c3 behave like metals or semiconductors under a forcing current. The electrons in the molecule essentially do not undergo collisions or lose energy (see FIG. 2), just as in superconductors. Therefore, this invention will provide easily produced and inexpensive materials and devices for generating zero or negative resistance($\Omega$/sq) which can be extensively applied to a wide variety of electronic switching devices mentioned above including an amplifier, an oscillator, diodes, or rectifiers and FEDs. An FED is a new type of flat-panel display in which electron emitters, arranged in a grid, are individually controlled by "cold" cathodes to generate colored light. Field emission display technology makes possible the thin panel of today's liquid crystal displays (LCDs), offers a wider field-of-view, provides the high image quality of today's cathode ray tube (CRT) displays, and requires less power than today's CRT displays. The present invention will replace conventional LCDs by cytochromes and these protein layers will behave like nanotube layers. In addition, protein switches of the present application will find use in nanocomputers over organic switches. The inventor has conducted several tests which show promising results for the molecular switches according to the invention of this application. Sheet resistance and temperature coefficient of resistance of cytochrome c adsorbed on Si/SiO2 devices have been developed and their electrical properties were investigated. The results demonstrated a very rapid decrease of sheet resistance towards zero or negative values with increasing forcing current.

Having thus shown and described what are at present considered to be preferred embodiments of the present invention, it should be noted that the same have been made by way of illustration and not limitation. Accordingly, all modifications, alterations and changes coming within the spirit and scope of the present invention are herein meant to be included.

REFERENCES:

1. K. K. Deb, "A protein microbolometer for focal plane arrays", *Materials Res. Innovation,* 2, 318-320 (1999).
2. N. Campbell, "Biology" 3$^{rd}$ edition, Benjamin-cumings, Reedwood City, Calif., p 185, (1993)
3. K. K. Deb, "Update: a protein microbolometer for focal plane arrays," *Materials Res. Innovation,* 3, 66-68 (1999).
4. M. Czjzek, et al., "Journal of Molecular Biology," 243, 653-667 (1994).

I claim:

1. A biomolecular switch, comprising:
   a first electrical contact;
   a second electrical contact;
   a monolayer of cytochrome $c_3$ sandwiched between and in direct contact with the first and second electrical contacts; and
   a substrate.

2. The biomolecular switch of claim 1 wherein at least one of the first and second electrical contacts are wires.

3. A biomolecular electronic switch comprising:
   a first electrical contact comprising a pure aluminum electrode 40-100 Å thick;
   a layer of electrode selected from the group of titanium or platinum, 30-80 Å thick, directly under the pure aluminum electrode;
   a monolayer of cytochrome $C_3$ 40 Å thick directly under the layer of electrode selected from the group of titanium or platinum;
   a layer of aluminum oxide electrode 30-80 Å thick, directly under the monolayer of cytochrome $C_3$;
   a layer of pure aluminum electrode 50-100 Å thick, directly under the layer of aluminum oxide;

a layer of silicon dioxide directly under the aluminum electrode; and a layer of silicon substrate.

4. The biomolecular switch of claim 1 wherein the first and second electrical contacts are directly connected to the monolayer of protein molecules such that the surface of the monolayer is in direct contact with both of the first and second electrical contacts.

5. The biomolecular switch of claim 1 wherein the first electrical contact is connected to a ground or voltage source and comprises a substantially metallic electrode, and wherein the a monolayer of cyctochrome $c_3$ has a first state when not exposed to IR radiation and a second state when the monolayer absorbs heat due to exposure to IR radiation; the monolayer of cyctochrome $c_3$ in the first state having a substantially higher resistivity than said second state such that upon the application of a voltage source to one of the first or second contacts a voltage potential will develop between said first and second contacts in said first state and will be substantially discharged in said second state when the monolayer of globular protein absorbs heat from the infrared radiation.

6. The biomolecular switch of claim 5 wherein the substrate is selected from the group of silicon or silicon dioxide and the monolayer of globular protein is absorbed on the substrate so as to produce a high coefficient of resistance value (TCR) of approximately 25% at an ambient temperature such that the absorption of infra red (IR) radiation is detected as a change in the resistivity of the detector element, whereby the resistivity of the biomolecular switch declines substantially upon the absorption of infrared radiation.

7. The biomolecular electronic switch of claim 1 wherein the sheet resistance of the monolayer of cytochrome $c_3$ is approximately 0.5 to 1 $\Omega/cm^2$ with a forcing current of 1 mA.

* * * * *